(12) United States Patent
Enzmann et al.

(10) Patent No.: US 12,176,678 B2
(45) Date of Patent: Dec. 24, 2024

(54) METHOD FOR OPERATING INDEPENDENTLY CONTROLLED LASER DIODES IN A DEVICE WHERE A SUBSET OF LASER DIODES CAN BE OPERATED IN THEIR NOMINAL CURRENT RANGE

(71) Applicant: OSRAM OLED GmbH, Regensburg (DE)

(72) Inventors: Roland Heinrich Enzmann, Gelugor (MY); Hubert Halbritter, Dietfurt (DE); Michael Klein, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 906 days.

(21) Appl. No.: 16/772,709

(22) PCT Filed: Nov. 29, 2018

(86) PCT No.: PCT/EP2018/083020
§ 371 (c)(1),
(2) Date: Jun. 12, 2020

(87) PCT Pub. No.: WO2019/115245
PCT Pub. Date: Jun. 20, 2019

(65) Prior Publication Data
US 2020/0328577 A1    Oct. 15, 2020

(30) Foreign Application Priority Data

Dec. 13, 2017   (DE) .................... 10 2017 129 790.1

(51) Int. Cl.
*H01S 5/042* (2006.01)
*H01S 3/10* (2006.01)
(Continued)

(52) U.S. Cl.
CPC .......... *H01S 5/042* (2013.01); *H01S 3/10069* (2013.01); *H01S 5/0617* (2013.01);
(Continued)

(58) Field of Classification Search
CPC ........ H01S 5/062; H01S 5/042; H01S 5/4018; H01S 5/4025; H01S 5/423; H01S 5/0014;
(Continued)

(56) References Cited

U.S. PATENT DOCUMENTS 5,604,757 A * 2/1997 Liang .................... H01S 5/4025
                                                    398/94
5,734,672 A * 3/1998 McMinn ............... H01S 5/4025
                                                    372/50.12

(Continued)

FOREIGN PATENT DOCUMENTS

| JP | 2001116812 A | 4/2001 |
| JP | 2009271406 A | 11/2009 |
| WO | 1994013045 A1 | 6/1994 |

*Primary Examiner* — M. A. Golub-Miller
(74) *Attorney, Agent, or Firm* — MH2 Technology Law Group LLP (57) ABSTRACT

In at least one embodiment of the method of operating a laser device (100) having a plurality of laser diodes (1) which can be controlled independently of one another, wherein controlled laser diodes are each operated with an operating current (I), and wherein each laser diode can be operated for a proper operation in a nominal current range ($\Delta I$), a step A) is carried out in which an input current ($I\_0$) or an input voltage ($U\_0$) is applied to the laser device. Furthermore, a step B) is carried out in which a characteristic value is determined that is representative of a number N of laser diodes that can be operated in the respective nominal current range with the input current applied in step A) or with the input voltage applied in step A). If the characteristic value is representative of $N \geq 1$, M laser diodes are controlled in a step C) in such a way that the M laser (Continued)

diodes are each operated in the nominal current range, wherein $1 \leq M \leq N$ is selected.

12 Claims, 8 Drawing Sheets

(51) Int. Cl.
    *H01S 5/06*       (2006.01)
    *H01S 5/062*     (2006.01)
    *H01S 5/42*       (2006.01)
    *H01S 5/40*       (2006.01)

(52) U.S. Cl.
    CPC ............ *H01S 5/062* (2013.01); *H01S 5/4018* (2013.01); *H01S 5/4025* (2013.01); *H01S 5/423* (2013.01)

(58) Field of Classification Search
    CPC . H01S 5/04256; H01S 5/0617; H01S 3/10069
    See application file for complete search history.

(56) References Cited

U.S. PATENT DOCUMENTS

| | | | | |
|---|---|---|---|---|
| 6,005,262 | A | 12/1999 | Cunningham et al. | |
| 6,246,708 | B1 | 6/2001 | Thornton et al. | |
| 8,599,892 | B2 * | 12/2013 | Senda | B23K 26/0613 |
| | | | | 372/38.1 |
| 9,815,140 | B2 * | 11/2017 | Hayashi | B23K 26/0608 |
| 10,051,247 | B2 * | 8/2018 | Nagashima | G02B 27/01 |
| 10,186,830 | B2 * | 1/2019 | Miyata | H01S 5/4012 |
| 10,305,252 | B2 * | 5/2019 | Muendel | H01S 5/4012 |
| 10,456,860 | B2 * | 10/2019 | Kyoto | B23K 26/0665 |
| 10,530,118 | B2 * | 1/2020 | Kashiwagi | H01S 3/1305 |
| 2002/0105982 | A1 * | 8/2002 | Chin | H01S 5/062 |
| | | | | 372/38.02 |
| 2003/0081638 | A1 * | 5/2003 | Hamster | H01S 5/423 |
| | | | | 257/E25.032 |
| 2005/0094691 | A1 * | 5/2005 | Yamazaki | G06K 15/1247 |
| | | | | 372/38.03 |
| 2006/0002270 | A1 * | 1/2006 | Shimizu | H04N 1/40031 |
| | | | | 369/116 |
| 2012/0269217 | A1 * | 10/2012 | Senda | B23K 26/0613 |
| | | | | 372/38.02 |
| 2014/0071219 | A1 * | 3/2014 | Kurashima | G03G 15/04036 |
| | | | | 372/29.011 |
| 2017/0070031 | A1 * | 3/2017 | Takigawa | H01S 5/0683 |
| 2017/0125976 | A1 * | 5/2017 | Sato | H01S 5/042 |
| 2017/0196061 | A1 * | 7/2017 | Simin | H05B 45/37 |
| 2017/0271843 | A1 * | 9/2017 | Batchelder | B29C 64/135 |
| 2017/0279246 | A1 * | 9/2017 | Muendel | B23K 26/0876 |
| 2018/0278018 | A1 * | 9/2018 | Tsuda | H01S 5/06216 |
| 2019/0305513 | A1 * | 10/2019 | Gapontsev | H01S 5/065 |
| 2021/0167572 | A1 * | 6/2021 | Tabata | H01S 5/042 |
| 2022/0255296 | A1 * | 8/2022 | Lowder | H01S 5/0617 |
| 2022/0297231 | A1 * | 9/2022 | Nishio | H01S 5/4018 |

\* cited by examiner

METHOD FOR OPERATING INDEPENDENTLY CONTROLLED LASER DIODES IN A DEVICE WHERE A SUBSET OF LASER DIODES CAN BE OPERATED IN THEIR NOMINAL CURRENT RANGE

CROSS-REFERENCE TO RELATED APPLICATIONS

This patent application is a national stage entry from International Application No. PCT/EP2018/083020, filed on Nov. 29, 2018, published as International Publication No. WO 2019/115245 A1 on Jun. 20, 2019, and claims priority under 35 U.S.C. § 119 from German patent application 10 2017 129 790.1, filed Dec. 13, 2017, the entire contents of all of which are incorporated herein by reference.

A method for operating a laser device is specified. Furthermore, a laser device is specified.

One task to be solved is to specify an efficient method of operating a laser device. Another task to be solved is to specify a laser device which can be operated with such a method.

These tasks are solved by the method and the subject-matter of the independent claims. Advantageous embodiments and further developments are subject of the dependent patent claims.

According to at least one embodiment, the laser device for the method comprises several independently controllable laser diodes. Laser diodes are also called semiconductor lasers. For example, the laser device comprises at least five or at least ten or at least 50 or at least 100 laser diodes. One or more or all laser diodes may be integrated in a single laser diode chip. However, the laser device may also comprise several laser diode chips.

Some or all of the laser diodes of the laser device may be individually controllable. Alternatively or additionally, several laser diodes can be combined into individually and independently controllable groups. Within a group, the laser diodes can be connected in series, for example. The laser diodes of a group can, for example, only be controlled together. Individually and independently controllable groups and/or individually and independently controllable laser diodes are, for example, connected in parallel to each other.

According to at least one embodiment, controlled laser diodes are each operated with an operating current. The operating current is the current that flows through the semiconductor layer sequence of the laser diode during operation. If the operating current is below a threshold value, the laser diode does not emit laser radiation. If the operating current is above the threshold value, the laser diode emits laser radiation.

According to at least one embodiment, each laser diode can be operated in a nominal current range for proper operation. The nominal current range is the current range in which the laser diode has a maximum, in particular a global maximum, in efficiency. The efficiency is specified as the ratio of the optical power emerging from the laser diode to the electrical power applied to the laser diode. This efficiency is also known as radiation efficiency and in English as wall plug efficiency, or WPE for short. For example, the nominal current range is the range of operating current in which the efficiency of the laser diode is at most than 20% or at most 10% or at most 5% or at most 2% or at most 1% below the maximum efficiency.

For example, the nominal current range of each laser diode is between 1 mA and 20 mA inclusive.

According to at least one embodiment, the method of operating the laser device comprises a step A) in which an input current or an input voltage is applied to the laser device. The input current or input voltage is in particular the total current or voltage provided to the laser device for conversion into laser radiation.

According to at least one embodiment, the method comprises a step B) in which a characteristic value is determined which is representative of a number N of laser diodes which can be operated in the respective nominal current range with the input current applied in step A) or with the input voltage applied in step A). The number N is an integer greater than or equal to zero. The number N is in particular the maximum number of laser diodes which can be operated with the laser device in the nominal current range at this input current/input voltage.

Preferably, the input current applied in step A) or the input voltage applied in step A) is not sufficient to operate all laser diodes in the nominal current range.

The number N can be any integer greater than or equal to zero. However, the number N can also be a number greater than or equal to zero, which can only have predetermined values. If, for example, the laser diodes are combined in groups comprising at least i laser diodes, where i is an integer greater than zero, and if the laser diodes within a group can only be driven jointly and only with the same operating current, then N can, for example, only have values greater than or equal to i.

In order to determine the representative characteristic value, the input current or the input voltage, for example, can be compared with reference values. Depending on which reference value the input current or input voltage matches, the result is how many and/or which laser diodes can be operated in the nominal current range.

According to at least one embodiment, the method comprises a step C) in which M laser diodes are controlled in such a way that the M laser diodes are each operated in the nominal current range. The number M is an integer greater than or equal to 1 and less than or equal to N. This means that in step C) at least one and at most as many laser diodes are operated in the nominal current range as were determined in step B). Step C) is performed if the characteristic value determined in step B) represents N≥1.

If the input current or input voltage from step A) is so low that no laser diode can be operated in the nominal current range, a step C0) can be performed instead of step C), in which one or more laser diodes are operated with an operating current below the nominal current range.

This means that a decision process can be carried out before step C). Only if step B) provides N≥1, M laser diodes are operated in the nominal current range in step C). Otherwise a step C0) can be carried out in which one or more laser diodes are operated below the nominal current range.

In particular, steps A) to C) are carried out in the specified order.

In at least one embodiment of the method of operating a laser device with a plurality of laser diodes which can be controlled independently of one another, wherein controlled laser diodes are each operated with an operating current and wherein each laser diode can be operated for a proper operation in a nominal current range, a step A) is carried out in which an input current or an input voltage is applied to the laser device. Furthermore, a step B) is carried out in which a characteristic value is determined which is representative of a number N of laser diodes which can be operated in the respective nominal current range with the input current applied in step A) or with the input voltage applied in step A). If the characteristic value is representative of N≥1, M laser diodes are driven in a step C) in such a way that the M laser diodes are each operated in the nominal current range, wherein 1≤M≤N is selected.

The present invention is based in particular on the finding that in laser devices with a plurality of laser diodes all laser diodes are usually operated simultaneously. If the application of the laser device is changed and thus the input current or the input voltage at the laser device is changed, this results in the laser diodes no longer being operated in their optimum current range, i.e. in the respective nominal current range. Therefore, different laser devices with different numbers of laser diodes are generally used for different applications.

The present invention is based in particular on the idea of providing a method of operating a laser device and a corresponding laser device with which a single laser device can be used for different applications. This is realized in particular by the fact that, depending on the set input current or set input voltage, either all laser diodes or only a subset of the laser diodes are operated in the nominal current range.

According to at least one embodiment, M=N laser diodes are controlled and operated in the nominal current range in step C). This means that in step C) as many laser diodes are operated in the nominal current range as were determined in step B) on the basis of the representative characteristic value. For example, only these N laser diodes are controlled and operated. No laser diodes are then operated at operating currents below the respective nominal current range.

According to at least one embodiment, the input current applied in step A) or the input voltage applied in step A) is sufficient to operate N laser diodes in the nominal current range and to operate one or more further laser diodes at an operating current below the nominal current range.

According to at least one embodiment, in addition to the M laser diodes, one or more further laser diodes are controlled in step C) and operated with an operating current below the nominal current range. Consequently, M laser diodes are operated in the most efficient operating mode, namely in the nominal current range, whereas one or more further laser diodes are operated in a less efficient mode, namely below the nominal current range.

According to at least one embodiment, the method comprises a step A1) in which the input current or the input voltage is increased. The "increasing" or "decreasing" can, for example, be done continuously and/or monotonically and/or uniformly.

According to at least one embodiment, the method comprises a step B1) in which a characteristic value is determined which is representative of a number N1 of laser diodes which can be operated with the increased input current or the increased input voltage in the nominal current range. For example, during the increase of the input current or the input voltage, the characteristic value representative of the number N1 is continuously determined anew on the basis of the currently applied input current or the currently applied input voltage, for example with a repetition frequency of at most 1 Hz or at most 0.1 Hz. In other words, the characteristic value can be determined in real time.

According to at least one embodiment, the method comprises a step C1) in which one or more laser diodes are switched on. Step C1) is performed if the characteristic value determined in step B1) represents a number N1 which is greater than the number N from step B). In particular, new laser diodes are only switched on when all previously operated laser diodes are operated in the nominal current range.

If the increased input current or the increased input voltage is not sufficient to operate more than N laser diodes in the nominal current range, no new laser diodes are switched on, for example.

When one or more laser diodes are switched on, the laser diodes are controlled with an operating current. The operating current of a switched on laser diode can be below the nominal current range or in the nominal current range depending on the increase of the input current or the input voltage. Preferably the input current or input voltage is increased continuously. In parallel, the operating currents through the switched on or controlled laser diodes can be continuously increased.

Steps A1) to C1) are performed in particular after steps A) to C).

According to at least one embodiment, one or more laser diodes are switched on in step C1) and laser diodes already operated before the switching on are controlled in such a way that they are operated in the nominal current range. This means that all laser diodes that were already operated before step C1) are operated in the nominal current range after or with step C1).

According to at least one embodiment, one or more laser diodes are switched on in step C1) and the input current is distributed essentially evenly over all controlled laser diodes. This means that all controlled laser diodes then have essentially the same operating current. "Essentially the same" means in particular that the operating current of a controlled laser diode deviates by a maximum of 20% or a maximum of 10% from the average value of the operating current averaged over all laser diodes. This is particularly easy to implement in terms of control technology.

According to at least one embodiment, in step C1) at most N1 laser diodes are controlled and all controlled laser diodes are operated in the nominal current range. In step C1), therefore, only so many laser diodes are switched on that after the input current has been distributed evenly, all laser diodes can be operated in the nominal current range.

According to at least one embodiment, the input current or the input voltage is increased in step A1) until the characteristic value K determined in step B1) is representative of a number N1 which deviates by a predetermined value K from the number N from step B). The value K is an integer. K is predetermined, for example, ≥1 or ≥2 or ≥4 or ≥6 or ≥10.

According to at least one embodiment, K laser diodes are switched on simultaneously in step C1). "Simultaneously" means, for example, that all K laser diodes are switched on in a time window of less than 1 ms or less than 1 μs.

The K laser diodes are, for example, laser diodes connected in series. For example, the value K corresponds to the number of laser diodes in a group. In step C1) the group of laser diodes is then controlled.

According to at least one embodiment, the value K is predetermined depending on the applied input current or the applied input voltage. For example, the value K is predetermined before or during step A1) is carried out. The value K is then determined on the basis of the input current or input voltage applied before or during the increase of the input current or input voltage.

According to at least one embodiment, the value K is predetermined the smaller the smaller the applied input current or the applied input voltage. For example, the laser device comprises groups of different numbers of laser diodes. The group of laser diodes switched on during the method is then selected depending on the applied input current or the applied input voltage.

According to at least one embodiment, in step C) at least two laser diodes are operated in the nominal current range. The input current or the input voltage in step A) is selected accordingly large.

According to at least one embodiment, the method comprises a step A2) following step C), in which the input current or the input voltage is reduced. The input current or input voltage is reduced continuously, for example.

According to at least one embodiment, the method comprises a step C2) following step C), in which the operating current is reduced in at least one laser diode, with at least one other laser diode continuing to be operated in the nominal current range.

The operating current in the at least one laser diode is reduced according to the reduction of the input current or the input voltage. For example, the operating current in the at least one laser diode is reduced simultaneously or in parallel with the input current or the input voltage. In particular, the operating current in the at least one laser diode is reduced to values below the nominal current range.

In particular, the other laser diode operated in the nominal current range is operated in the nominal current range until the at least one laser diode is completely switched off, i.e. no laser radiation is emitted any more or it is operated with an operating current of zero or a negligible operating current.

In addition, a laser device is specified. The laser device can be operated in particular with the method described herein. All features described in connection with the method are therefore disclosed for the laser device and vice versa.

According to at least one embodiment, the laser device comprises a plurality of laser diodes. The laser device may in particular comprise a laser diode chip with a plurality of laser diodes. For example, the laser diode chip comprises a semiconductor layer sequence with an active layer. The laser diodes comprise, for example, different areas of the semiconductor layer sequence and the active layer. Preferably, the laser diode chip comprises exactly one contiguous semiconductor layer sequence. For example, the laser diode chip has an area between 0.1 mm$^2$ and 1 mm$^2$ inclusive.

The laser diodes are preferably GaN based laser diodes or GaAs based laser diodes or InP based laser diodes.

According to at least one embodiment, the laser device comprises a carrier with integrated electronic switches. The electronic switches may be transistors, such as field effect transistors, in particular MOSFETs, or bipolar transistors.

According to at least one embodiment, the laser device comprises a control unit. The control unit is used in particular to operate the electronic switches. The control unit may also be integrated in the carrier or mechanically connected to the carrier.

According to at least one embodiment, the laser diodes are mounted and electrically connected on the carrier. In particular, the laser diode chip is mounted and electrically connected on the carrier. Different laser diodes are electrically connected to different electronic switches.

According to at least one embodiment, the laser diodes can be controlled by means of the electronic switches. The electronic switches can thus be used to determine whether, and preferably also how much current flows through a laser diode.

According to at least one embodiment, controlled laser diodes are each operated with an operating current. The height of the operating current can be set, for example, via the electronic switches.

According to at least one embodiment, each laser diode can be operated in a nominal current range for proper operation.

According to at least one embodiment, at least some, for example all, laser diodes can be controlled independently of other laser diodes. For example, the laser device comprises several individually controllable laser diodes and/or several individually controllable groups of laser diodes. Each individually controllable laser diode or each individually controllable group of laser diodes is preferably uniquely assigned to exactly one electronic switch.

According to at least one embodiment, the control unit is configured to control the electronic switches depending on an input current or an input voltage applied to the laser device in such a way that a different number of laser diodes is operated in the nominal current range for different input currents or different input voltages.

The control unit is thus configured in such a way that, during operation of the laser device, it controls which electronic switches are open, i.e. essentially do not let any current through, or are closed, i.e. let current through. In addition, the control unit preferentially controls how much current a closed switch lets through. The control unit can, for example, include a comparator that compares an applied input current or an applied input voltage with reference values. Depending on which reference value the applied input current or the applied input voltage matches, different switches are closed or opened and the associated laser diodes are operated in the nominal current range or switched off.

According to at least one embodiment, the laser device is configured to perform a method according to one or more of the embodiments described above.

According to at least one embodiment, the carrier comprises a semiconductor substrate. The electronic switches are at least partially integrated in the semiconductor substrate. In particular, the carrier may be an integrated circuit or an IC-chip. The semiconductor substrate is preferably based on silicon. The electronic switches are preferably transistors, whereby the n- and p-doped regions of the transistors are formed from the semiconductor material of the semiconductor substrate.

According to at least one embodiment, the laser diodes are surface emitters, also called Vertical-Cavity Surface-Emitting Lasers, VCSEL for short. Alternatively, the laser diodes can also be edge-emitting laser diodes.

According to at least one embodiment, several laser diodes are combined into a group of laser diodes. For example, at least two or at least four or at least six or at least ten laser diodes are combined into a group.

According to at least one embodiment, the laser diodes of a group are connected in series.

According to at least one embodiment, the laser diodes of a group can be controlled jointly by means of a switch, preferably by exactly one switch. The laser diodes of a group are therefore assigned the same switch. The laser diodes of a group can then only be controlled together.

In the following, a method of operating a laser device described herein and a laser device described herein are explained in more detail with reference to drawings on the basis of exemplary embodiments. Same reference signs indicate same elements in the individual figures. However, the size ratios involved are not to scale, individual elements may rather be illustrated with an exaggerated size for a better understanding.

FIGS. 4A to 7C show various graphs for exemplary embodiments of the method

Figure 1:
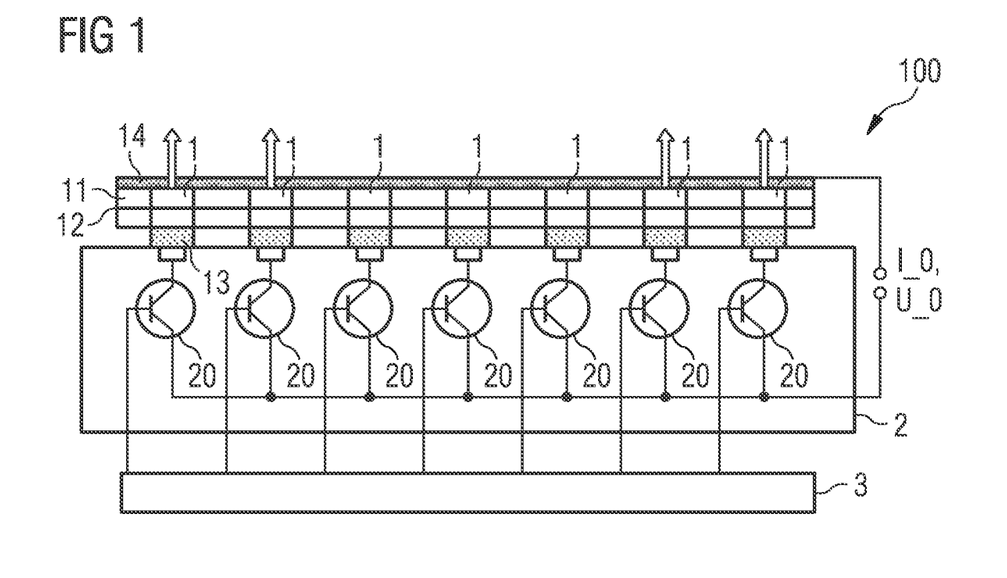
FIG. 1 shows an exemplary embodiment of a laser device in a side view.

FIG. 1 shows an exemplary embodiment of a laser device 100 comprising a plurality of laser diodes 1. The laser diodes 1 are formed in a common and contiguous semiconductor layer sequence 11. The semiconductor layer sequence 11 comprises an active layer 12 in which the laser radiation is generated.

Each laser diode 1 comprises a first contact element 13 and a second contact element 14 for the electrical contacting of the laser diodes 1. The laser diodes 1 are in this case surface emitters, so-called VCSELs.

The laser device 100 comprises a carrier 2 with a plurality of electronic switches 20 in the form of transistors, such as bipolar transistors or field effect transistors. For example, carrier 2 is an IC-chip.

The laser diodes 1 are arranged on a carrier 2. Different electronic switches 20 are assigned to different laser diodes 1, which can be used to control the laser diodes 1. Controlled laser diodes 1 are operated with an operating current and emit laser radiation as soon as the operating current exceeds a threshold value. In FIG. 1, only the outer laser diodes 1 are controlled and emit laser radiation, as indicated by the arrows.

The laser device 100 in FIG. 1 further comprises a control unit 3, which, for example, comprises a comparator. The control unit 3 is configured to control the electronic switches 20, i.e. to open or close them. In addition, the control unit 3 can be configured to also control the amount of current flowing through a closed electronic switch 20.

FIG. 1 shows that the laser device 100 is supplied with an input current I_0 or an input voltage U_0. The laser device 100 is configured to control a different number of electronic switches 20 at different input currents I_0 or different input voltages U_0 in such a way that a different number of laser diodes 1 is operated in a nominal current range for different input currents I_0 or different input voltages U_0.

Figure 2A:
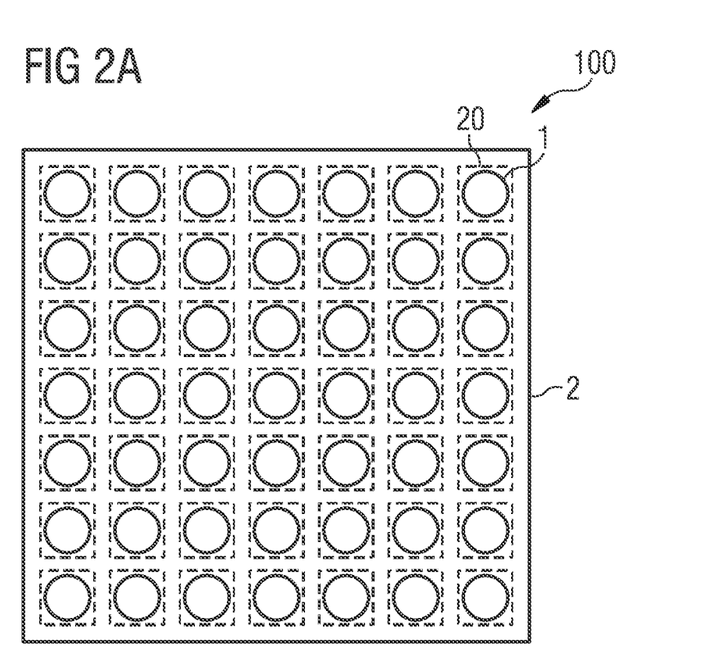
FIGS. 2A to 2C show exemplary embodiments of laser devices in top view.

FIG. 2A shows an exemplary embodiment of a laser device 100 in top view. The laser device 100 comprises 49 laser diodes 1, each of which is uniquely assigned its own electronic switch 20. The electronic switches 20 are not visible in the plan view and are only indicated as dotted boxes in FIG. 2A. In the exemplary embodiment of FIG. 2A each laser diode 1 can be controlled independently of other laser diodes 1 by means of a switch 20.

Depending on the embodiment, the laser device 100 can also include significantly more or fewer laser diodes 1 than shown in FIG. 2A.

Figure 2B:
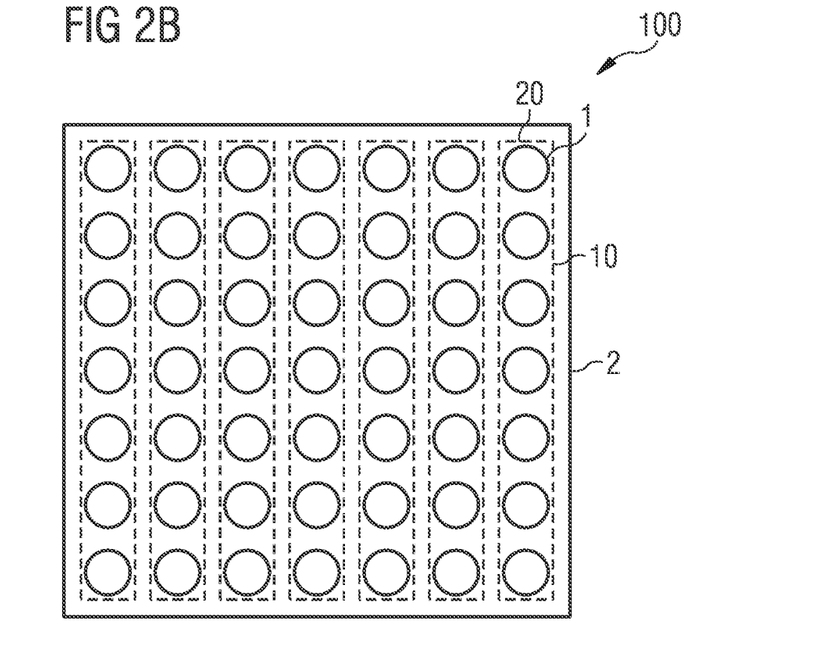

FIG. 2B shows another exemplary embodiment of a laser device 100 in top view. Again, the laser device 100 comprises 49 laser diodes 1. However, in this exemplary embodiment, in each case seven laser diodes 1 are combined into a group 10 of laser diodes 1. Each group 10 of laser diodes 1 is uniquely assigned an electronic switch 20. The group 10 can be controlled by means of the electronic switch 20. Within a group 10 the laser diodes 1 are connected in series, for example.

Figure 2C:
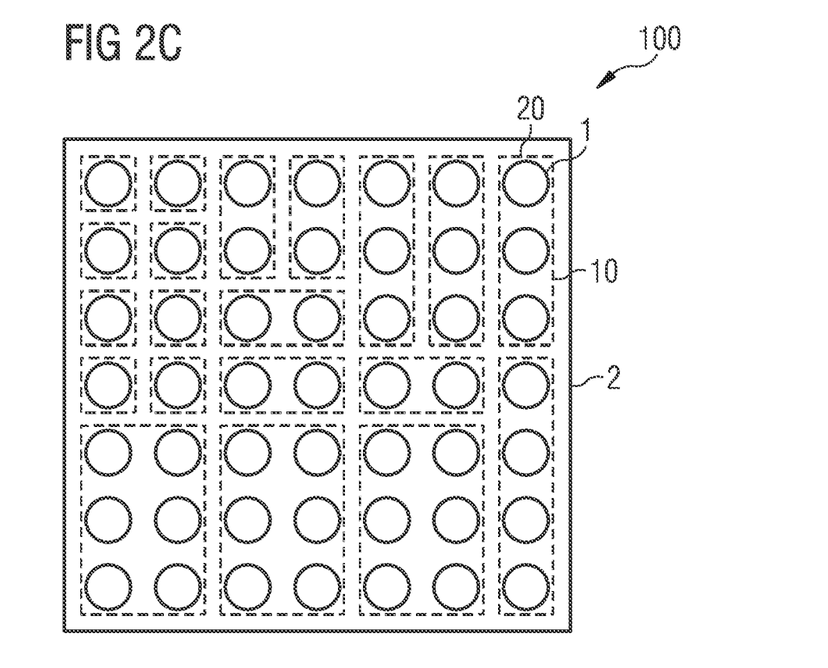

FIG. 2C shows another exemplary embodiment of a laser device 100 in top view. Again the laser device 100 comprises 49 laser diodes 1. In this example, some of the laser diodes 1 are combined into groups 10 of two, three, four or six laser diodes 1. Exactly one electronic switch 20 is assigned to each group 10, by which the respective group 10 of laser diodes 1 can be controlled. Some of the laser diodes 1 are uniquely assigned their own electronic switch 20.

The laser device 100 of FIG. 2C, for example, is configured such that at low input currents I_0 or low input voltages U_0 only individual laser diodes 1 or small groups 10 of laser diodes 1 are operated. With an increasing input current I_0 or input voltage U_0, for example, increasingly larger groups 10 of laser diodes 1 are switched on.

Figure 3:
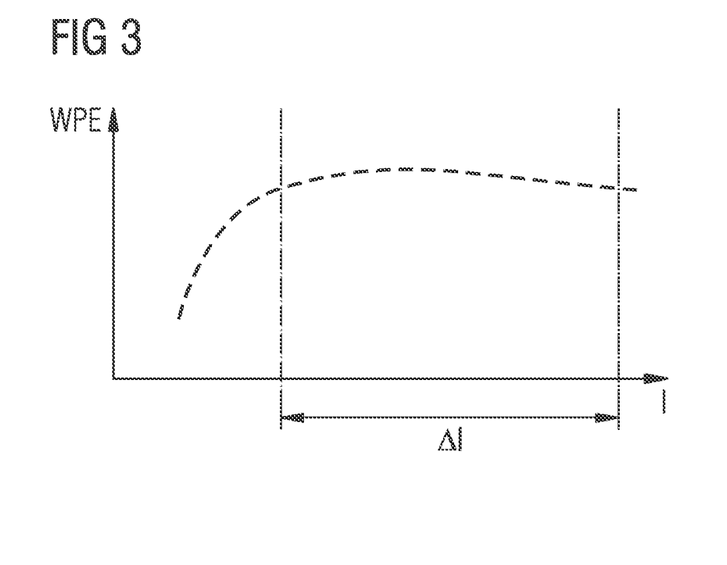
FIG. 3 shows an example of the efficiency of a laser diode as a function of the operating current.

FIG. 3 shows the efficiency of laser diode 1 as a function of the operating current in the laser diode 1 (dashed line). On the y-axis, the efficiency, also Wall-Plug-Efficiency, short WPE, is indicated. On the x-axis, the operating current I in the laser diode 1 is indicated. Below a threshold value for the operating current, the laser diode 1 does not generate any laser radiation. At an operating current above the threshold value, the laser diode starts to emit laser radiation. Initially, the efficiency increases significantly. Afterwards, a maximum efficiency is reached. Afterwards, the efficiency drops slightly as the operating current I increases.

FIG. 3 shows a nominal current range $\Delta I$. At an operating current within the nominal current range $\Delta I$ the efficiency WPE of the laser diode 1 is less than 20% below the maximum efficiency of the laser diode 1.

Figure 4A:
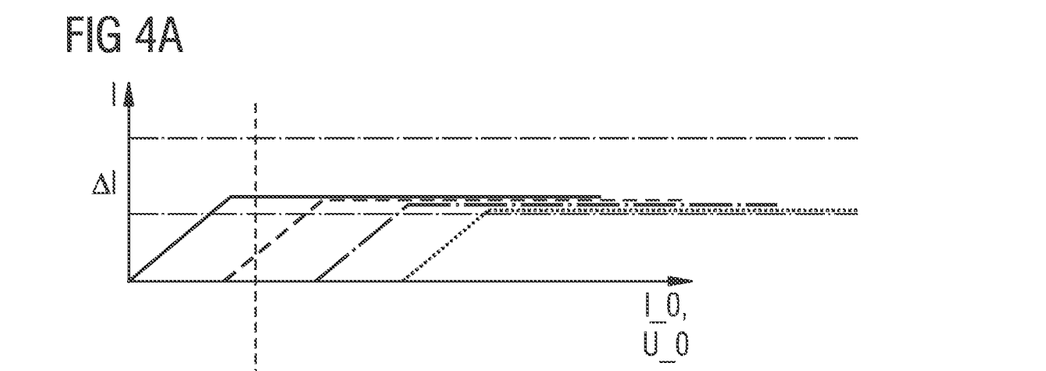
Figure 4B:
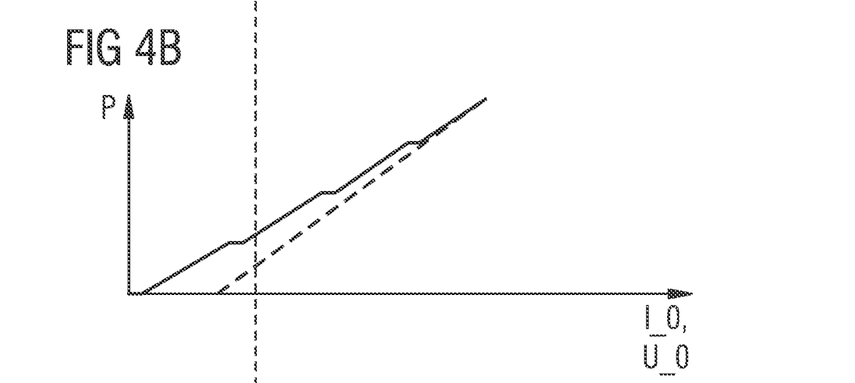
Figure 4C:
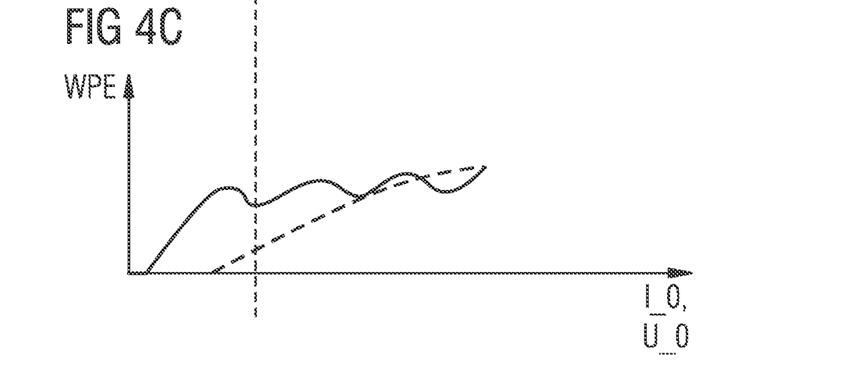

FIGS. 4A to 4C show diagrams illustrating the sequence of an exemplary embodiment of the method. The illustrated method can be carried out using, for example, the laser device 100 of FIG. 2A.

FIG. 4A shows the operating current I of a first laser diode as a function of the input current I_0 applied to the laser device 100 or the input voltage U_0 applied to laser device 100 as a solid line. The dashed line shows the operating current I of a second laser diode as a function of the input current I_0 or the input voltage U_0. The dashed-dotted line shows the operating current I of a third laser diode as a function of the input current I_0 or the input voltage U_0. The dotted line shows the operating current I of a fourth laser diode as a function of the input current I_0 or the input voltage U_0.

With a first input current I_0 or a first input voltage U_0, marked by the vertical dotted line in FIG. 4, the first laser diode is operated in the nominal current range $\Delta I$. The second laser diode is operated at an operating current I below the nominal current range $\Delta I$. For example, the input current I_0 or input voltage U_0, marked by the vertical dashed line, is only sufficient to operate the first laser diode in the nominal current range $\Delta I$, but not the second laser diode.

When the input current I_0 or the input voltage U_0 is increased, the operating current I in the second laser diode is continuously increased. The operating current I of the first laser diode remains in the nominal current range $\Delta I$.

When the input current I_0 or the input voltage U_0 is increased further, the second laser diode can be operated in the nominal current range $\Delta I$ in addition to the first laser diode.

After reaching the nominal current range $\Delta I$ for the second laser diode, the third laser diode 1 is switched on and is initially operated with an operating current I below the nominal current range $\Delta I$. A further increase of the input current I_0 or the input voltage U_0 is converted into an increase of the operating current I of the third laser diode, while the first and the second laser diode continue to be operated in the nominal current range $\Delta I$.

After the third laser diode has reached the nominal current range $\Delta I$, the fourth laser diode is switched on.

FIG. 4B shows the optical output power P of the laser device 100 as a function of the input current I_0 or the input voltage $U\_0$ (solid line). An increase of the input current $I\_0$ or the input voltage $U\_0$ leads to an increase of the optical power. If a new laser diode is switched on, the optical power remains constant for a certain interval. This is due to the threshold value of the switched on laser diode. Below the threshold value, the laser diode does not emit any laser radiation.

FIG. 4B also shows, for comparison, the optical output power of a modified method in which all laser diodes of the laser device are always operated simultaneously and with essentially the same operating current (dashed line). It can be seen that with the modified method laser radiation is only generated at a higher input current $I\_0$ or a higher input voltage $U\_0$.

FIG. 4C shows the efficiency achieved for the laser device with the method described above as a function of the input current $I\_0$ or the input voltage $U\_0$ (solid line). For comparison, the efficiency achieved with the modified method is shown (dashed line). In particular, it can be seen that for a small input current $I\_0$ or a small input voltage $U\_0$, the efficiency of the method described herein is considerably greater than the efficiency achieved with the modified method.

Figure 5A:
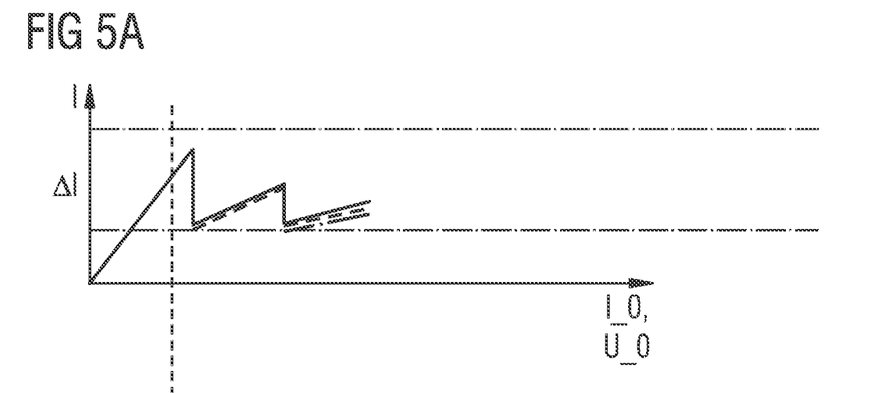
Figure 5B:
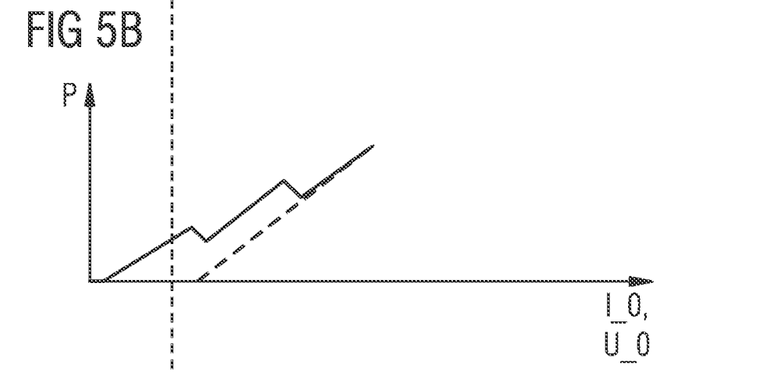
Figure 5C:
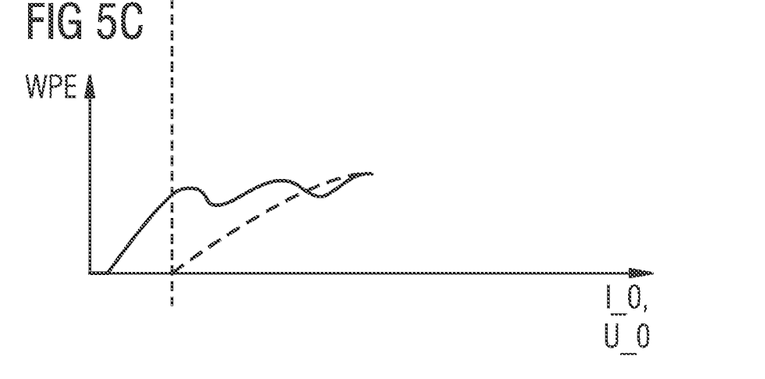

FIGS. 5A to 5C show diagrams that illustrate the sequence of a further exemplary embodiment of the method. The illustrated method can be carried out with the laser device 100 in FIG. 2A, for example.

FIG. 5A shows that at a first input current $I\_0$ or a first input voltage $U\_0$ (vertical dashed line) only a first laser diode is operated (solid line). The first laser diode is operated in the nominal current range $\Delta I$. When the input current $I\_0$ or the input voltage $U\_0$ is increased, the operating current I of the first laser diode is further increased, but remains in the nominal current range $\Delta I$.

Starting from a certain input current $I\_0$ or a certain input voltage $U\_0$ a second laser diode (dashed line) is switched on. The input current $I\_0$ applied to the laser device is divided equally between the first laser diode and the second laser diode so that they are operated with essentially the same operating current I. In particular, the first laser diode and the second laser diode are operated in the nominal current range $\Delta I$ even after the second laser diode is switched on.

When the input current $I\_0$ or the input voltage $U\_0$ increases further, the operating currents I in the first laser diode and the second laser diode increase.

Starting from a certain input current $I\_0$ or a certain input voltage $U\_0$ a third laser diode (dashed-dotted line) is switched on. The applied input current $I\_0$ is again distributed evenly to all three laser diodes, so that all laser diodes are operated with essentially the same operating currents I and each within the nominal current range $\Delta I$.

The optical power P and the efficiency WPE of a laser device operated in this way are shown in FIGS. 5B and 5C (solid line). For comparison, the optical power P and the efficiency WPE of a laser device operated with the modified method are shown.

Figure 6A:
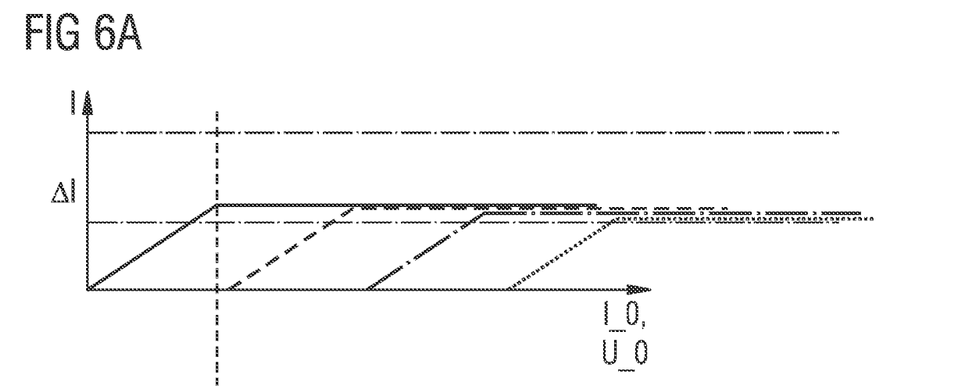
Figure 6B:
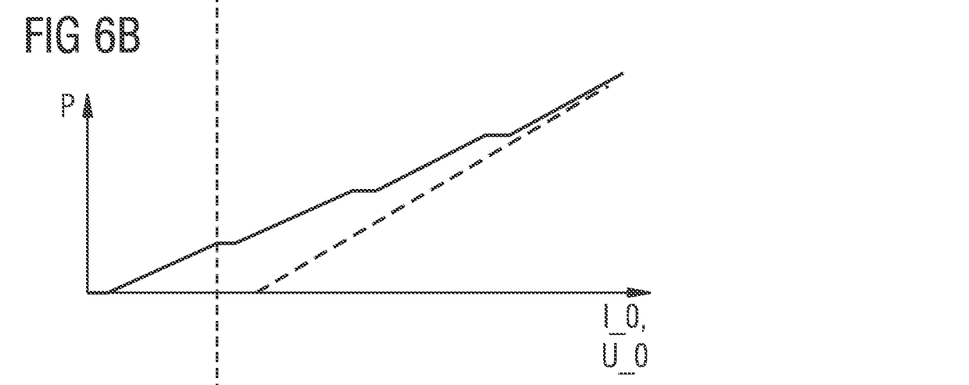
Figure 6C:
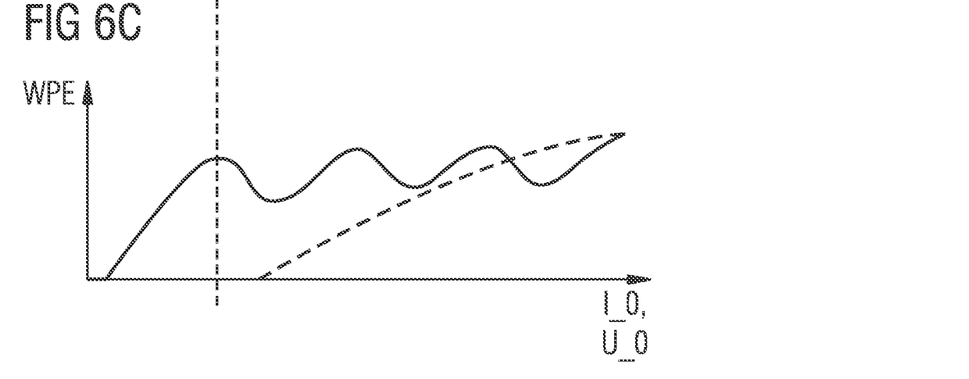

FIGS. 6A to 6C show diagrams illustrating the method of another exemplary embodiment of the method. The illustrated method can be carried out with the laser device 100 of FIG. 2B, for example.

The difference to the exemplary embodiment of FIGS. 5A to 5C is that individual laser diodes are not controlled independently of each other and one after the other, but that a number of laser diodes are always switched on simultaneously. This is achieved, for example, by grouping several laser diodes into a controllable group as shown in FIG. 2B.

FIG. 6A again shows the operating current I per laser diode in the laser device on the y-axis. FIGS. 6B and 6C show the optical power P and the efficiency WPE of the entire laser device.

Figure 7A:
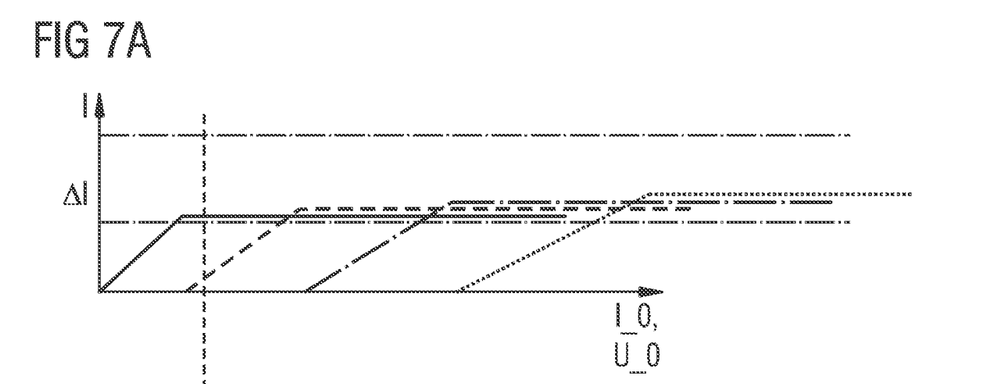
Figure 7B:
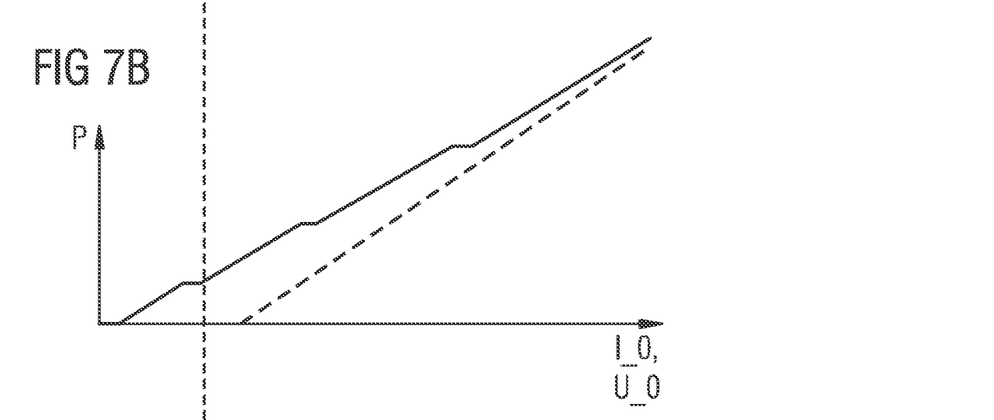
Figure 7C:
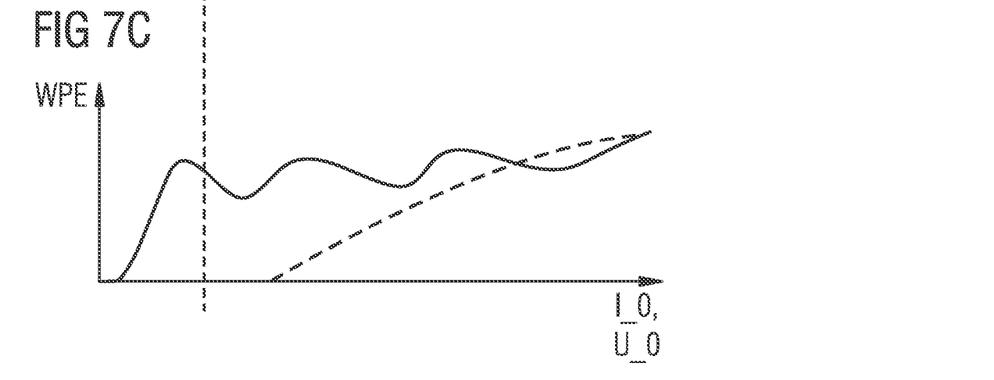

FIGS. 7A to 7C show diagrams that illustrate the sequence of another exemplary embodiment of the method. The illustrated method can be carried out using, for example, the laser device 100 of FIG. 2C.

In contrast to the exemplary embodiment of FIGS. 6A to 6C, the groups of laser diodes switched on here are of different sizes.

FIG. 7A again shows the operating current per laser diode on the y-axis. With a first input current $I\_0$ or a first input voltage $U\_0$ (vertical dashed line), for example, only a first laser diode is operated in the nominal current range $\Delta I$. A group of several second laser diodes, for example of two second laser diodes, is also controlled. The second laser diodes are all operated at the same operating current I below the nominal current range $\Delta I$.

When the input current $I\_0$ or the input voltage $U\_0$ is increased, the operating current I in the second laser diodes is increased and the operating current in the first laser diode remains within the nominal current range $\Delta I$.

As soon as the second laser diodes have each reached the nominal current range $\Delta I$, a group of third laser diodes is switched on, for example a group of three third laser diodes, wherein all third laser diodes are operated with the same operating current I below the nominal current range $\Delta I$.

A further increase of the input current $I\_0$ or the input voltage $U\_0$ results in all third laser diodes reaching the nominal current range $\Delta I$. A group of fourth laser diodes is then switched on. The group of the fourth laser diodes comprises, for example, four or more than four fourth laser diodes.

In other words, with the method described in connection with FIG. 7A, the number of laser diodes switched on depends on the input current $I\_0$ or the input voltage $U\_0$. The higher the input current $I\_0$ or the input voltage $U\_0$, the larger are the groups of switched on laser diodes.

Thus, a very fine resolution can be achieved at low currents and a higher resolution at high currents.

Figure 8:
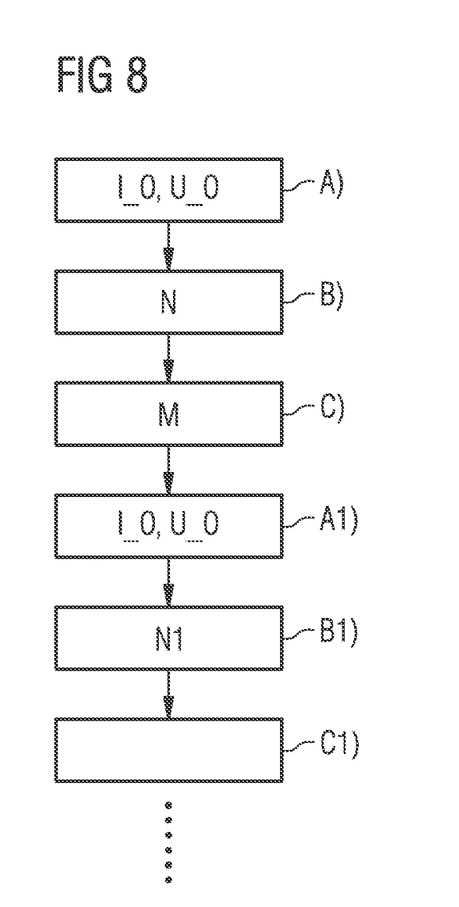
FIG. 8 shows a flow chart of an exemplary embodiment of the method.

FIG. 8 shows a flowchart of an exemplary embodiment of the method.

In a step A) an input current $I\_0$ or an input voltage $U\_0$ is applied to a laser device, for example to one of the laser devices 100 of FIGS. 1 to 2C.

In a subsequent step B) a characteristic value is determined which is representative of how many laser diodes N of the laser device can be operated with the applied input current $I\_0$ or the applied input voltage $U\_0$ in the nominal current range $\Delta I$.

If the value N is greater than or equal to 1, M laser diodes are controlled in a step C) in such a way that the M laser diodes are each operated in the nominal current range $\Delta I$. M is selected to be less than or equal to N. The remaining laser diodes are not controlled or are operated with an operating current I below the nominal current range $\Delta I$.

In a later step A1) the input current $I\_0$ or the input voltage $U\_0$ is increased. Afterwards or during this, a step B1) is carried out in which a characteristic value is determined which is representative of how many laser diodes N1 can be operated with the increased input current $I\_0$ or increased input voltage $U\_0$ in the nominal current range $\Delta I$.

After step B1) a step C1) is carried out. For example, step C1) is only carried out if the value N1 is greater than the value N from step B). In step C1), one or more further laser diodes are switched on additionally to the laser diodes already operated.

This patent application claims the priority of the German patent application 10 2017 129 790.1, the disclosure content of which is hereby incorporated by reference.

The invention is not limited to the description based on the exemplary embodiments. Rather, the invention comprises every new feature as well as every combination of features, which in particular includes every combination of features in the patent claims, even if these features or this combination itself is not explicitly stated in the patent claims or the exemplary embodiments.

LIST OF REFERENCE SIGNS 1 laser diode
2 carrier
3 control unit
11 semiconductor layer sequence
12 active layer
13 first contact element
14 second contact element
20 electronic switch
100 laser device
I0 input current
U0 input voltage
ΔI nominal current range
I operating current

The invention claimed is:

1. A method of operating a laser device, wherein
the laser device comprises several laser diodes which can be controlled independently of one another,
controlled laser diodes are each operated with an operating current,
each laser diode can be operated in a nominal current range for proper operation, wherein the nominal current range is the range of operating currents in which the efficiency of the laser diode is at most 20% below the maximum efficiency,
the method comprising the following steps:
A) applying an input current or an input voltage to the laser device;
"B) determining a characteristic value which is representative of a maximum number N of laser diodes . . . " which can be operated in the respective nominal current range with the input current applied in step A) or with the input voltage applied in step A) by comparing the input current or the input voltage applied in step A) with a set of reference values; and, if the characteristic value represents N≥1,
C) controlling M laser diodes in such a way that the M laser diodes are each operated in the nominal current range, wherein 1≤M≤N is selected.

2. The method according to claim 1, wherein
in step C) M=N laser diodes are controlled and operated in the nominal current range.

3. The method according to claim 1, wherein
the input current applied in step A) or the input voltage applied in step A) is sufficient to operate N laser diodes in the nominal current range and to operate one or more further laser diodes at an operating current below the nominal current range,
in step C), in addition to the M laser diodes, one or more further laser diodes are controlled and operated with an operating current below the nominal current range.

4. The method according to claim 1, further comprising the following steps:
A1) increasing the input current or the input voltage;
B1) determining a characteristic value which is representative of a number N1 of laser diodes, which can be operated with the increased input current or the increased input voltage in the nominal current range; and, if the number N1 is greater than the number N from step B),
C1) switching on one or more laser diodes.

5. The method according to claim 4, wherein
in step C1) one or more laser diodes are switched on and laser diodes already operated before the switching on are controlled so that they are operated in the nominal current range.

6. A method according to claim 4, wherein
in step C1), one or more laser diodes are switched on, the input current being distributed essentially evenly over all the controlled laser diodes.

7. The method according to claim 6, wherein
in step C1), at most N1 laser diodes are controlled and all controlled laser diodes are operated in the nominal current range.

8. The method according to claim 4, wherein
in step A1) the input current or the input voltage is increased until the characteristic value K determined in step B1) is representative of a number N1 which differs by a predetermined value K from the number N from step B),
in step C1) K Laser diodes are switched on simultaneously.

9. The method according to claim 8,
wherein the value K is predetermined depending on the input current or the input voltage applied.

10. The method according to claim 9,
wherein the value K is predetermined the smaller the smaller the applied input current or the applied input voltage.

11. The method according to claim 1, wherein
in step C) at least two laser diodes are operated in the nominal current range,
the method comprises the steps following step C):
A2) reducing the input current or the input voltage;
C2) reducing the operating current in at least one laser diode, wherein at least one other laser diode continues to be operate in the nominal current range.

12. A method of operating a laser device, wherein
the laser device comprises several laser diodes which can be controlled independently of one another,
controlled laser diodes are each operated with an operating current,
each laser diode can be operated in a nominal current range for proper operation, wherein the nominal current range is the range of operating currents in which the efficiency of the laser diode is at most 20% below the maximum efficiency,
the method comprising the following steps:
A) applying an input current or an input voltage to the laser device;
"B) determining a characteristic value which is representative of a maximum number N of laser diodes . . . " which can be operated in the respective nominal current range with the input current applied in step A) or with the input voltage applied in step A) by comparing the input current or the input voltage applied in step A) with a set of reference values, wherein the input current or input voltage is such that N laser diodes can be operated in the respective nominal current range but only below the maximum efficiency; and, if the characteristic value represents N≥2, C) controlling M laser diodes in such a way that the M laser diodes are each operated in the nominal current range and below the respective maximum efficiency, wherein 1≤M≤ N is selected, wherein Step B) is executed before step C).

* * * * *

UNITED STATES PATENT AND TRADEMARK OFFICE
CERTIFICATE OF CORRECTION

| | | |
|---|---|---|
| PATENT NO. | : 12,176,678 B2 | Page 1 of 1 |
| APPLICATION NO. | : 16/772709 | |
| DATED | : December 24, 2024 | |
| INVENTOR(S) | : Roland Heinrich Enzmann et al. | |

It is certified that error appears in the above-identified patent and that said Letters Patent is hereby corrected as shown below:

In the Claims

At Column 11, Lines 45 to 46, ““B) determining a characteristic value which is representative of a maximum number N of laser diodes...”” should be --B) determining a characteristic value which is representative of a maximum number N of laser diodes--, At Column 12, Lines 60 to 61, ““B) determining a characteristic value which is representative of a maximum number N of laser diodes...”” should be --B) determining a characteristic value which is representative of a maximum number N of laser diodes--, At Column 13, Line 7, "Nis" should be --N is--.

Signed and Sealed this
Eleventh Day of February, 2025

Coke Morgan Stewart
*Acting Director of the United States Patent and Trademark Office*